United States Patent
Komatsu et al.

(10) Patent No.: US 11,990,504 B2
(45) Date of Patent: May 21, 2024

(54) CAPACITOR WITH MIM

(71) Applicant: SUMITOMO ELECTRIC DEVICE INNOVATIONS, INC., Kanagawa (JP)

(72) Inventors: Yoshihide Komatsu, Yokohama (JP); Takeshi Igarashi, Yokohama (JP); Hiroyuki Oguri, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 47 days.

(21) Appl. No.: 17/369,705

(22) Filed: Jul. 7, 2021

(65) Prior Publication Data

US 2021/0335992 A1    Oct. 28, 2021

Related U.S. Application Data (63) Continuation of application No. 16/411,668, filed on May 14, 2019, now Pat. No. 11,152,457.

(30) Foreign Application Priority Data

May 15, 2018    (JP) ................................. 2018-093539

(51) Int. Cl.
*H01L 23/52*    (2006.01)
*H01L 49/02*    (2006.01)
*H01L 23/522*    (2006.01)

(52) U.S. Cl.
CPC .......... *H01L 28/75* (2013.01); *H01L 23/5223* (2013.01)

(58) Field of Classification Search
None
See application file for complete search history.

(56) References Cited

U.S. PATENT DOCUMENTS

| 5,476,816 A * | 12/1995 | Mautz ............... H01L 21/76801 |
| | | 257/E21.582 |
| 5,968,280 A | 10/1999 | Ronay |
| 2005/0085082 A1 | 4/2005 | Dougan |
| 2008/0002330 A1* | 1/2008 | Park .................. H01L 21/3105 |
| | | 361/311 |
| 2008/0076688 A1* | 3/2008 | Barnes .................... C11D 3/28 |
| | | 134/42 |
| 2008/0149922 A1 | 6/2008 | Lin |
| 2010/0207243 A1 | 8/2010 | Kim |

(Continued)

FOREIGN PATENT DOCUMENTS

| JP | H9-171985 | 6/1997 |
| JP | H11-154734 | 6/1999 |

(Continued)

OTHER PUBLICATIONS

JP Office Action dated Aug. 17, 2021.

*Primary Examiner* — Moin M Rahman
(74) *Attorney, Agent, or Firm* — SMITH, GAMBRELL & RUSSELL, LLP (57) ABSTRACT

A capacitor having a MIM structure includes a dielectric formed by laminating a plurality of times on an upper surface of a lower electrode, and an upper electrode on an upper surface of the dielectric. Forming of the dielectric includes forming the first dielectric layer on the upper surface of the lower electrode, cleaning an upper surface of the first dielectric layer by at least one of jet cleaning and dual fluid cleaning, and forming the second dielectric layer on an upper surface of the cleaned first dielectric layer.

5 Claims, 7 Drawing Sheets

(56) References Cited

U.S. PATENT DOCUMENTS

2016/0282673 A1\* 9/2016 Takemura ......... G02F 1/133719
2017/0352666 A1\* 12/2017 Ahn ................... H10B 12/0335
2019/0096800 A1 3/2019 Wei

FOREIGN PATENT DOCUMENTS

| JP | 2001-210787 | 8/2001 |
|----|-------------|--------|
| JP | 2003-297789 | 10/2003 |
| JP | 2006-86155  | 3/2006 |
| JP | 2014-72359  | 4/2014 |

\* cited by examiner

CAPACITOR WITH MIM

CROSS-REFERENCE TO RELATED APPLICATIONS

This application is based upon and claims the benefit of priority from U.S. patent application Ser. No. 16/411,668, filed on 14 May 2019, and from Japanese Patent Application No. 2018-093539, filed on 15 May 2018, the entire contents of which are incorporated herein by reference.

TECHNICAL FIELD

An aspect of the disclosure relates to a method of manufacturing a capacitor having an MIM structure.

BACKGROUND

A metal insulator metal (MIM) type capacitor has a lower electrode, a dielectric and an upper electrode. The lower electrode, the dielectric and the upper electrode are laminated in that order. A MIM type capacitor is used in semiconductor integrated circuits and the like. The manufacturing process of a MIM type capacitor includes a step of forming the dielectric on an upper surface of the lower electrode, and a step of forming the upper electrode on an upper surface of the dielectric. Furthermore, the manufacturing process of the capacitor includes a cleaning step. The cleaning step is performed at a point in time at which cleaning is required.

Japanese Unexamined Patent Publication No. 2001-210787 discloses a method of manufacturing an MIM type capacitance circuit. First, a lower electrode is formed. For the formation of the lower electrode, a metal which is not easily oxidized by sulfuric acid such as TiN is used. Next, a surface of the lower electrode is cleaned. A solution containing sulfuric acid is used for cleaning. Thereafter, a capacitive film is laminated on a surface of the cleaned lower electrode. As a result of cleaning the surface of the lower electrode, organic substances and oxides are removed from the surface of the lower electrode. As a result, leakage current caused by the organic substances and the oxides is prevented.

Japanese Unexamined Patent Publication No. 2006-086155 discloses a method of manufacturing a semiconductor device having a MIM type capacitor. First, the MIM type capacitor is integrated with a first insulating film of a semiconductor substrate. Further, an upper wiring of a lead-out wiring is integrated with the first insulating film of the semiconductor substrate. The MIM type capacitor includes an upper electrode, a capacitive insulating film and a lower electrode. Next, the first insulating film in a region in which the MIM type capacitor is formed is removed to such a depth that the capacitive insulating film is not exposed. Dry etching is used to remove the first insulating film. Next, the capacitive insulating film is removed. Wet etching is used to remove the capacitive insulating film. In the step of removing the capacitive insulating film, a photoresist is not deposited on the capacitive insulating film. As a result, the capacitive insulating film is not irradiated with oxygen plasma used for ashing. Therefore, it is possible to prevent dielectric breakdown and contamination of the capacitive insulating film due to a decrease in flatness of the capacitive insulating film.

Japanese Unexamined Patent Publication No. 2014-072359 discloses a substrate processing apparatus. The apparatus cleans a wafer using dual fluid cleaning in a semiconductor process.

SUMMARY

The disclosure describes a method of manufacturing a capacitor having a MIM structure in which a lower electrode, a dielectric, and an upper electrode are laminated. The method of manufacturing a capacitor includes forming the dielectric by laminating it a plurality of times on an upper surface of the lower electrode, and forming the upper electrode on an upper surface of the dielectric. The dielectric includes a first dielectric layer which is formed on an upper surface of the lower electrode, and a second dielectric layer which is formed on an upper surface of the first dielectric layer and is in contact with the upper electrode. In the forming of the dielectric, at least one first dielectric layer is formed on the upper surface of the lower electrode, an upper surface of the first dielectric layer is cleaned by at least one of jet cleaning and dual fluid cleaning, and the second dielectric layer is formed on an upper surface of the cleaned first dielectric layer.

DETAILED DESCRIPTION

Problems to be Solved by the Disclosure

In a process of manufacturing an MIM capacitor, fine foreign substances (particles) may be attached to a surface of a dielectric during formation of the dielectric. The formation of the dielectric is hindered in a portion to which the foreign substances are attached. As a result, the dielectric may include a defect portion in which a thickness thereof is locally thin. An electrode distance from the lower electrode to the upper electrode in the portion including the defect portion is narrower than an electrode distance in a portion not including the defect portion.

An electric field strength increases as the electrode distance narrows. A dielectric breakdown voltage decreases as the electric field strength increases. A lifetime (TDDB lifetime) due to time dependent dielectric breakdown (TDDB) of the dielectric decreases as the electric field strength increases. The reliability of a capacitor is reduced due to a decrease in the dielectric breakdown voltage and a decrease in the TDDB lifetime. A thickness of the dielectric in the defect portion cannot be controlled. That is, the electrode distance of the defect portion cannot also be controlled. Therefore, a range in which the dielectric breakdown voltage decreases and a range in which the TDDB lifetime decreases cannot be controlled either. As a result, variation in the reliability of the capacitor becomes large.

Advantageous Effects of the Disclosure

The method of manufacturing a capacitor according to the disclosure can reduce the variation in the reliability of the capacitor.

DESCRIPTION OF EMBODIMENTS OF THE DISCLOSURE

The disclosure describes a method of manufacturing a capacitor having an MIM structure in which a lower electrode, a dielectric, and an upper electrode are laminated. The method of manufacturing a capacitor includes a step of forming a dielectric on an upper surface of the lower electrode by laminating it a plurality of times, and a step of forming the upper electrode on an upper surface of the dielectric. The dielectric includes a first dielectric layer formed on the upper surface of the lower electrode, and a second dielectric layer formed on an upper surface of the first dielectric layer and is in contact with the upper electrode. In the step of forming the dielectric, at least one first dielectric layer is formed on the upper surface of the lower electrode, the upper surface of the first dielectric layer is cleaned by at least one of jet cleaning and dual fluid cleaning, and the second dielectric layer is formed on the upper surface of the cleaned first dielectric layer.

In this manufacturing method, the formation of the dielectric is performed in a plurality of laminating steps. The upper surface of the first dielectric layer is cleaned by at least one of the jet cleaning and the dual fluid cleaning. By this cleaning, particles attached to the first dielectric layer during the laminating can be removed. After cleaning, the second dielectric layer is further formed. Therefore, even when a thickness of the first dielectric layer is reduced due to particles attached during the laminating of the first dielectric layer, a thickness of the dielectric is compensated by the second dielectric layer formed after removal of the particles. Thus, the dielectric including the first dielectric layer and the second dielectric layer can ensure the desired electrode distance. As a result, the variation in the reliability of the capacitor can be reduced.

In one form, the upper surface of the second dielectric layer may be cleaned by at least one of a immersion cleaning method and a shower cleaning method prior to the step of forming the upper electrode. According to this process, damage to the second dielectric layer can be suitably suppressed. Furthermore, the variation in the reliability of the capacitor can be reduced.

In one form, the step of forming the upper electrode may be performed without cleaning the upper surface of the second dielectric layer. According to this process, damage to the second dielectric layer can be further suppressed.

In one form, a minimum value of the thickness of the first dielectric layer may be at least 50 nm. Also by this process, the variation in the reliability of the capacitor can be suitably reduced.

Hereinafter, a method of manufacturing a capacitor according to the disclosure will be described in detail with reference to the drawings. In addition, the method of manufacturing a capacitor according to the disclosure is not limited to these examples. The method of manufacturing a capacitor according to the disclosure is shown by the claims and is intended to include all modifications within the scope and meaning equivalent to the claims. Further, the same or corresponding parts in the drawings are denoted by the same reference numerals. Additionally, redundant description will be omitted.

Figure 1:
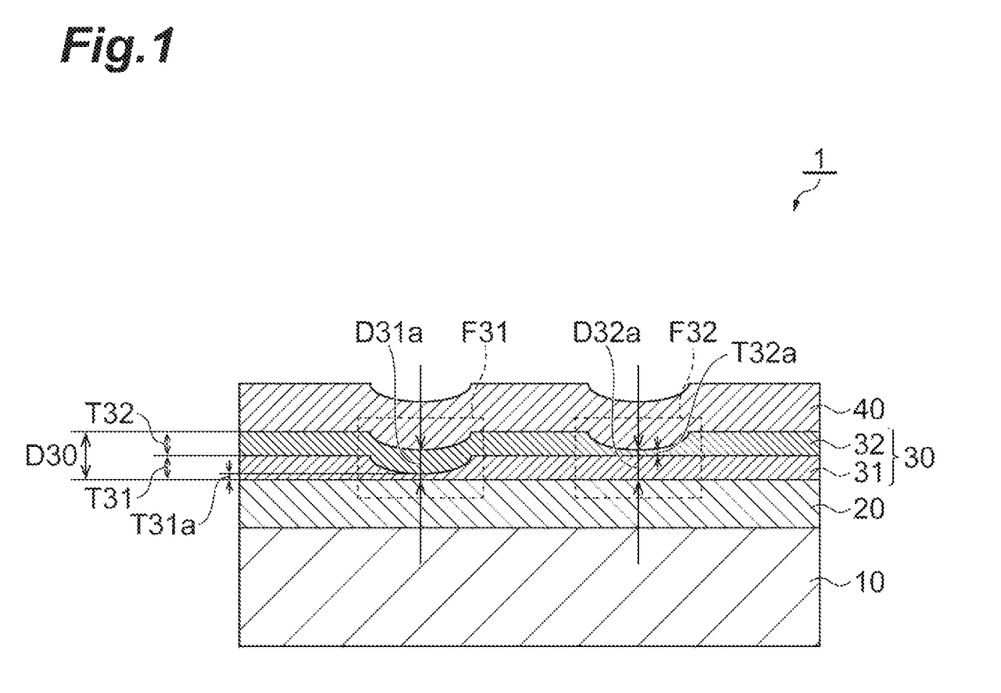
FIG. 1 is a view showing a structure of a capacitor obtained by a method of manufacturing a capacitor according to the disclosure.

FIG. 1 shows a capacitor 1. The capacitor 1 is manufactured by a method of manufacturing a capacitor according to the disclosure. The capacitor 1 has a so-called MIM structure. The capacitor 1 includes a substrate 10, a lower electrode 20 as a metal layer, a first dielectric layer 31 as an insulating layer, a second dielectric layer 32 as an insulating layer, and an upper electrode 40 as a metal layer. A thickness of the first dielectric layer 31 is a first target thickness T31. A thickness of the second dielectric layer 32 is a second target thickness T32. The first dielectric layer 31 and the second dielectric layer 32 constitute a dielectric 30. The dielectric 30 has defect portions F31 and F32. A thickness D31a of the dielectric 30 of the defect portion F31 is a sum (D31a=T31a+T32) of a thickness T31a of the first dielectric layer 31 and the second target thickness T32 of the second dielectric layer 32. A thickness D32a of the dielectric 30 of the defect portion F32 is a sum (D32a=T31+T32a) of the first target thickness T31 and a thickness T32a of the second dielectric layer 32.

The method of manufacturing a capacitor according to the disclosure includes forming the first dielectric layer 31 on an upper surface of the lower electrode 20. The thickness of the first dielectric layer 31 is the first target thickness T31. Next, the second dielectric layer 32 is formed on the upper surface of the first dielectric layer 31. The thickness of the second dielectric layer 32 is the second target thickness T32. Thereafter, the upper electrode 40 is formed on an upper surface of the second dielectric layer 32.

Figure 2:
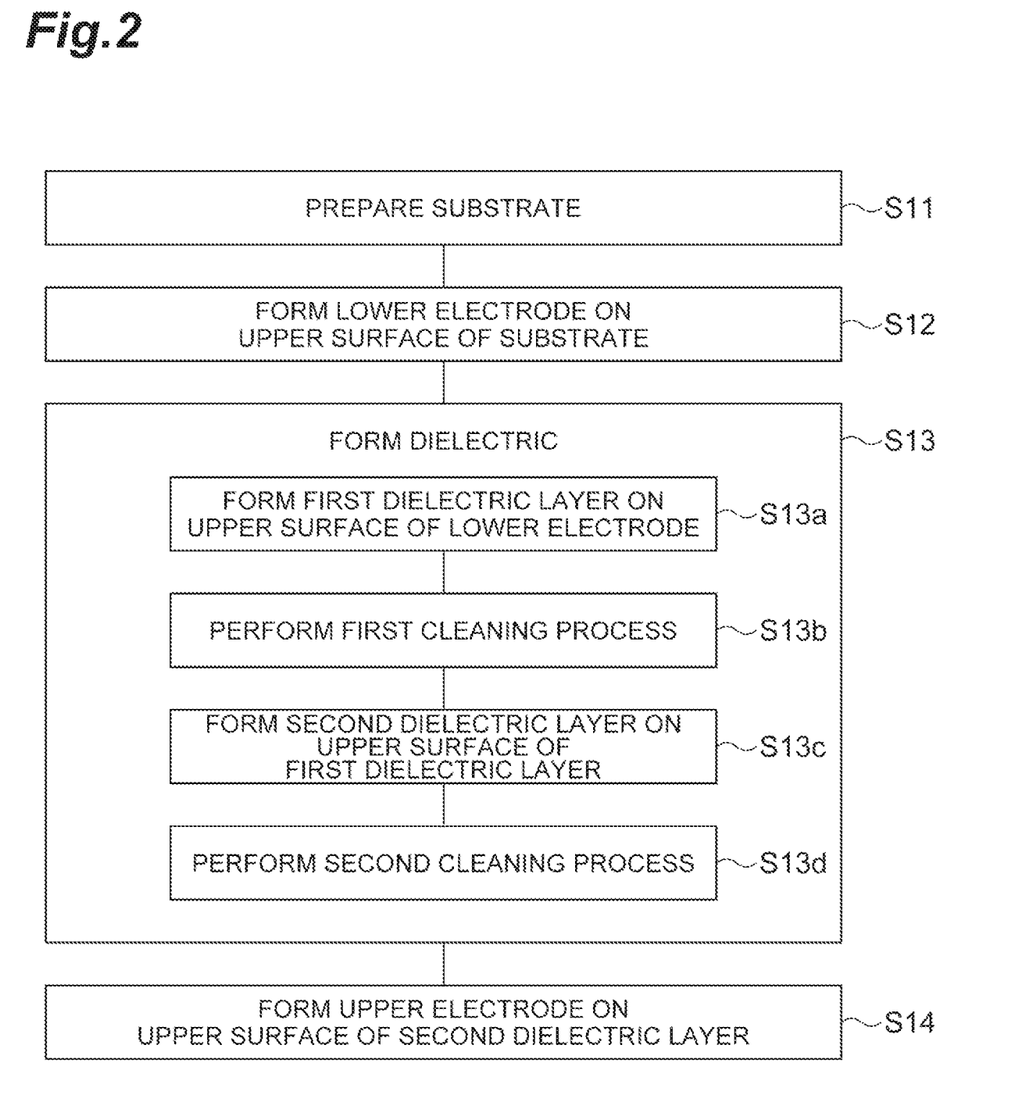
FIG. 2 is a process view showing main steps in the method of manufacturing a capacitor of the disclosure.

Hereinafter, the method of manufacturing a capacitor shown in a process view of FIG. 2 will be described.

First, the substrate 10 is prepared (Step S11). The substrate 10 is formed of, for example, silicon carbide (SiC), silicon (Si), gallium arsenide (GaAs), gallium nitride (GaN) or the like. Next, the lower electrode 20 is formed on an upper surface of the substrate 10 (Step S12). The lower electrode 20 is, for example, gold (Au) having a thickness of 200 nm. The lower electrode 20 may be a multilayer film of Ti/Au. A sputtering method may be used to form the lower electrode 20.

Next, the dielectric 30 is formed (Step S13). First, the first dielectric layer 31 is formed on an upper surface of the lower electrode 20 (Step S13a). The thickness of the first dielectric layer 31 is the first target thickness T31. The thickness (the first target thickness T31) of the first dielectric layer 31 that is formed first is, for example, 100 nm. In Step S13, a layer of silicon nitride (SiN) is formed. For example, a plasma CVD (p-CVD) method may be used in Step S13.

Figure 3A:
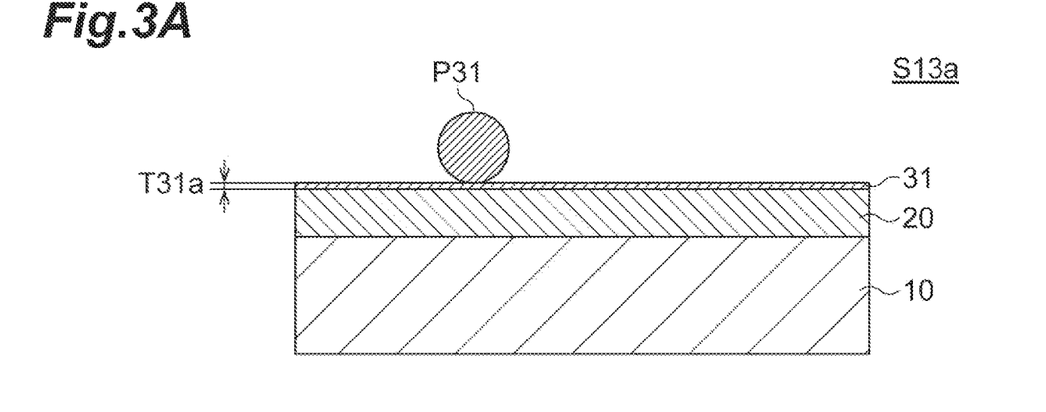
FIGS. 3A, 3B and 3C are views for explaining the main steps in the method of manufacturing a capacitor according to the disclosure.
Figure 3B:
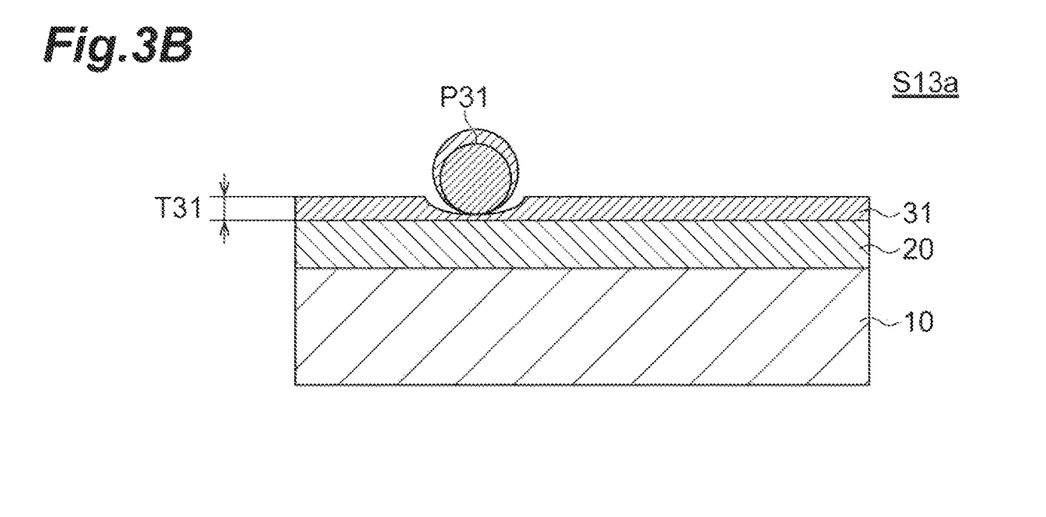

When the first dielectric layer 31 is formed to have a thickness T31a (T31>T31a), it is assumed that particles P31 are attached to the first dielectric layer 31 which is being formed (refer to FIG. 3A). The thickness T31a is, for example, 50 nm. The step of forming the first dielectric layer 31 is performed to the first target thickness T31 (100 nm). However, when the step is further performed in a state in which the particles P31 are attached, the formation of the first dielectric layer 31 is hindered in a portion to which the particles P31 are attached (refer to FIG. 3B). As a result, upon the completion of Step S13a, the thickness of the first dielectric layer 31 in the portion to which the particles P31 are attached may be smaller than the first target thickness T31. That is, the thickness of the first dielectric layer 31 in the portion to which the particles P31 are attached is thinner than the first target thickness T31.

Figure 3C:
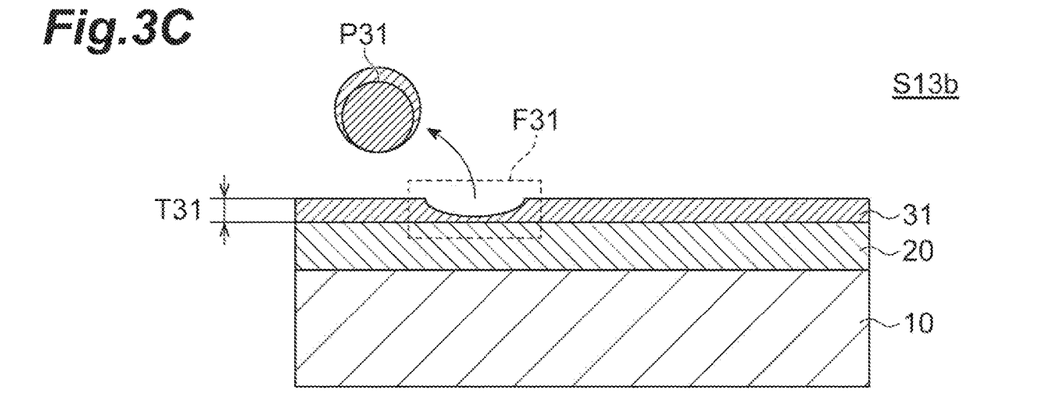

After the first dielectric layer 31 is formed, a first cleaning process is performed (Step S13b). As shown in FIG. 3C, the particles P31 are removed in the first cleaning process. In the cleaning process for the first dielectric layer 31, one of a jet cleaning method and a dual fluid cleaning method is used. The jet cleaning method and the dual fluid cleaning method have high performance for removing the particles P31. Therefore, according to these cleaning processes, the particles P31 attached to the first dielectric layer 31 can be more reliably removed. More preferably, in the cleaning process for the first dielectric layer 31, the dual fluid cleaning method may be used. The dual fluid cleaning method has higher performance for removing the particles P31. Furthermore, the dual fluid cleaning method is less likely to cause damage to an object being cleaned. As a result of removing the particles P31 in Step S13b, the defect portion F31 which is locally thin is exposed.

Subsequently, the second dielectric layer 32 is formed on an upper surface of the first dielectric layer 31 (Step S13c). In Step S13c, a layer of SiN is formed on the upper surface of the first dielectric layer 31. In Step S13c, a p-CVD method may be used. In Step S13c, the second dielectric layer 32 is formed to the second target thickness T32. The second target thickness T32 is, for example, 100 nm.

Figure 4A:
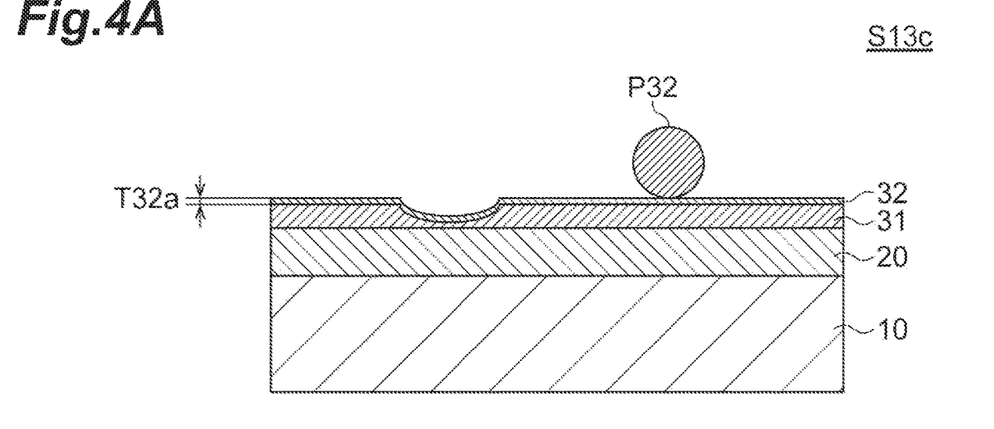
FIGS. 4A, 4B and 4C are views for explaining the main steps in the method of manufacturing a capacitor according to the disclosure.

Here, when the second dielectric layer 32 is formed to have a thickness T32a, it is assumed that new particles P32 are attached (refer to FIG. 4A). A position in which the particles P32 are attached is different from that of the particles P31. The thickness T32a is, for example, 50 nm. As a result, a thin portion is generated in the second dielectric layer 32.

Figure 4B:
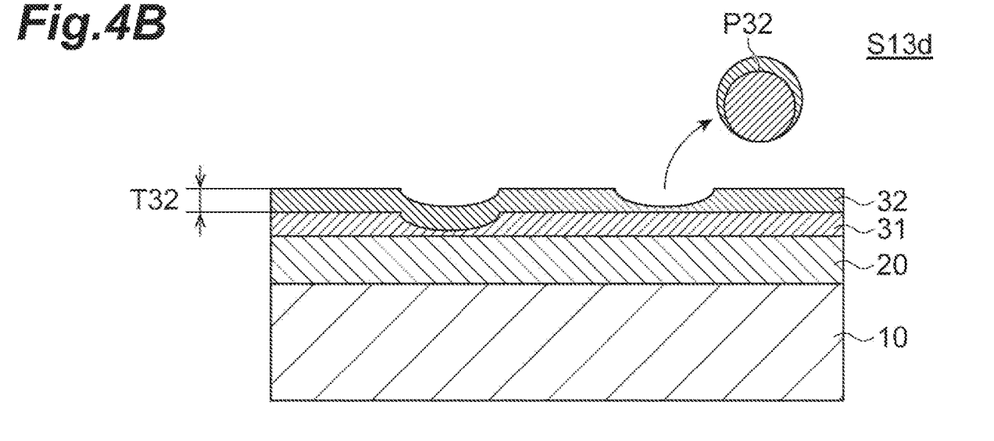

After the second dielectric layer 32 is formed, a second cleaning process is performed (Step S13d). The particles P32 are removed by performing the second cleaning process (refer to FIG. 4B). In the cleaning process for the second dielectric layer 32, a cleaning method in which a large impact force is generated when a cleaning medium collides with the particles P32 may be used. However, when this cleaning method is used, there is a possibility that the first dielectric layer 31 under the second dielectric layer 32 may be damaged. For example, when the particles P32 are detached, the second dielectric layer 32 may also be separated. That is, a cleaning method which may damage a surface of the second dielectric layer 32 is not preferable. Therefore, in the cleaning process for the second dielectric layer 32, a cleaning method in which damage to the object to be cleaned does not easily occur is used. An immersion cleaning method and a shower cleaning method may be used as the cleaning method in which damage to the object to be cleaned does not easily occur.

Figure 4C:
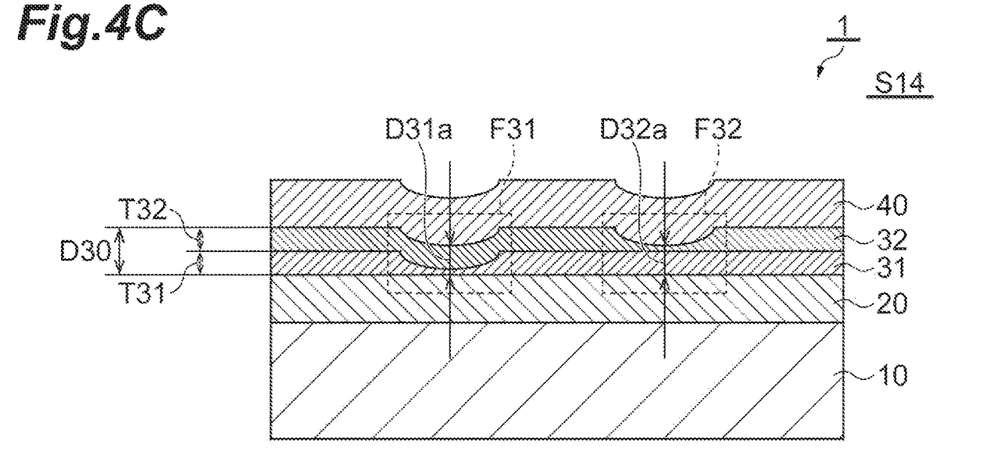

As shown in FIG. 4C, the upper electrode 40 is formed on an upper surface of the second dielectric layer 32 (Step S14). For example, a layer of gold (Au) having a thickness of 200 nm is formed in Step S14. A vapor deposition method may be used in Step S14. As a result of performing the above Steps S11 to S14, the capacitor 1 is obtained.

Hereinafter, a subject of a method of manufacturing a capacitor 100 according to a comparative example will be described in detail.

Figure 5A:
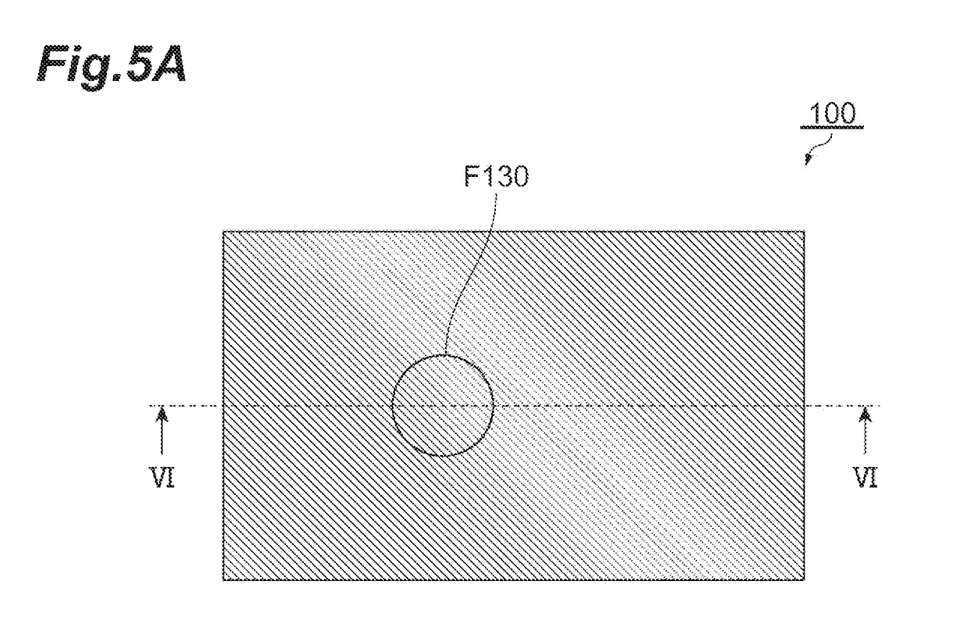
FIGS. 5A and 5B are views showing a structure of a capacitor according to a comparative example obtained by a method of manufacturing a capacitor according to the comparative example.
Figure 5B:
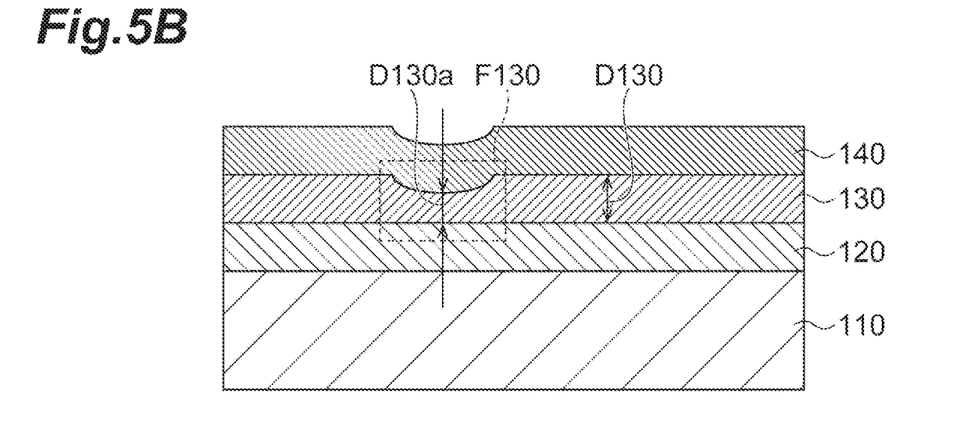

FIG. 5A is a plan view of the capacitor 100 according to a comparative example. FIG. 5B is a cross-sectional view of the capacitor 100 along line VI-VI of FIG. 5A. The capacitor 100 has a lower electrode 120, a dielectric 130, and an upper electrode 140. The layers are laminated in that order. The lower electrode 120 is formed on an upper surface of the substrate 110. The dielectric 130 is formed on an upper surface of the lower electrode 120. The upper electrode 140 is formed on an upper surface of the dielectric 130.

The substrate 110 is, for example, silicon carbide (SiC). The lower electrode 120 is, for example, gold (Au) having a thickness of 200 nm. The lower electrode 120 is formed, for example, by a sputtering method. The dielectric 130 is, for example, silicon nitride (SiN) having a thickness of 200 nm. The dielectric 130 is formed by, for example, a chemical vapor deposition (CVD) method. The upper electrode 140 is, for example, gold (Au) having a thickness of 200 nm. The upper electrode 140 is formed by, for example, a vapor deposition method. The capacitor 100 of the comparative example includes a defect portion F130. In the defect portion F130, a thickness of the dielectric 130 is locally thin. A thickness D130a of the dielectric 130 at the defect portion F130 is thinner than a thickness D130 of the dielectric 130 in a non-defective region.

The capacitor 100 shown in FIGS. 5A and 5B is formed by the following manufacturing method shown as a comparative example.

Figure 6A:
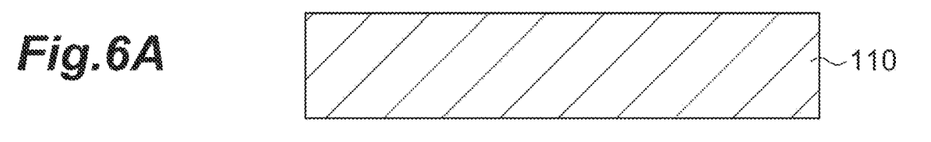
FIGS. 6A, 6B, 6C, 6D and 6E are views for explaining main steps in the method of manufacturing the capacitor according to the comparative example.

First, the substrate 110 is prepared (refer to FIG. 6A). Next, the lower electrode 120 is formed on an upper surface of the substrate 110. Next, the dielectric 130 is formed on an upper surface of the lower electrode 120. The thickness of the dielectric 130 is a thickness T130a. The thickness T130a is, for example, 100 nm. The thickness T130a is ½ of the thickness D130.

Figure 6B:
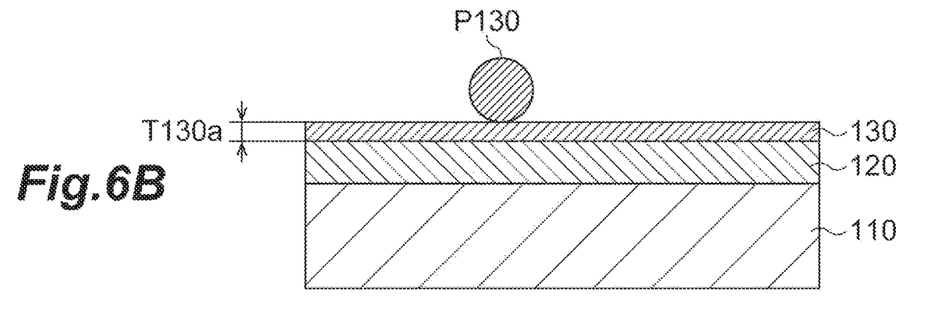
Figure 6C:
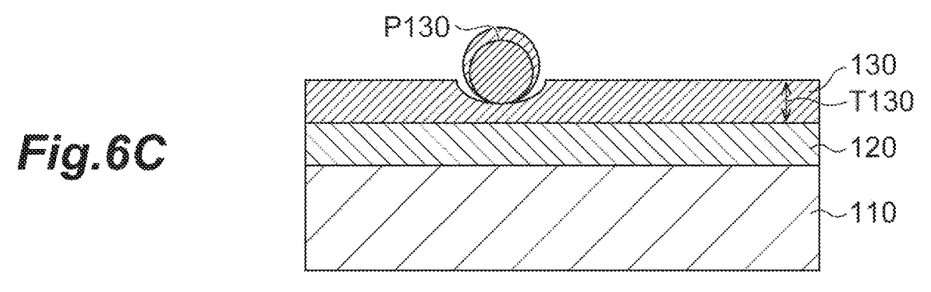

As shown in FIG. 6B, it is assumed that particles P130 have been attached to the dielectric 130 in this step. The cause of generation of the particles P130 is, for example, dust from a main body of a CVD apparatus, separation of a product adhering to the inside of a reaction container of the CVD apparatus, and so on. When the CVD apparatus is appropriately managed, a particle diameter of the generated particles P130 is, for example, about 0.1 µm or more and 5 µm or less. In addition, when the CVD apparatus is appropriately managed, a density of the particles P130 which are attached during formation of the dielectric 130 is, for example, 2/cm$^2$ or less. A planar size of the MIM capacitor is generally 10 µm or more and several mm or less. Therefore, a defect density assumed from the density is extremely small. However, when the particles P130 are attached, a thickness of the dielectric 130 in a portion to which the particles P130 are attached becomes thinner (refer to FIG. 6C).

Figure 6D:
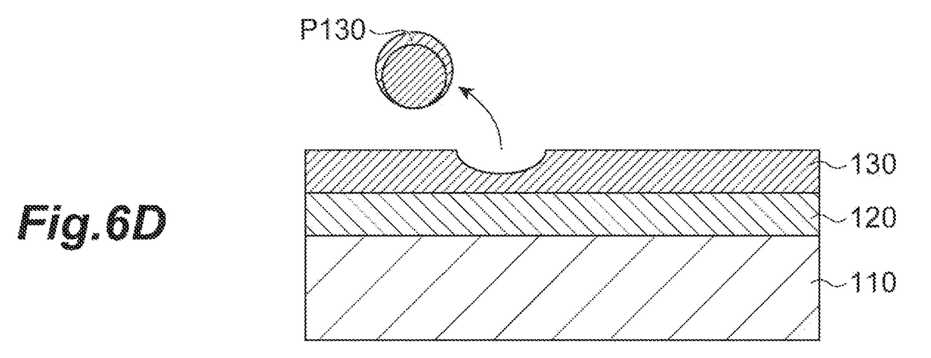
Figure 6E:
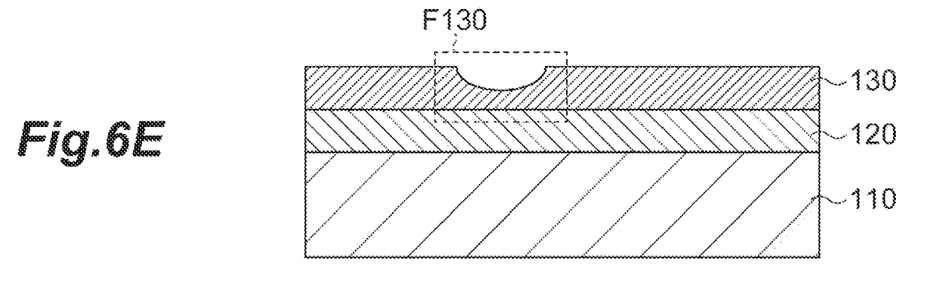

As shown in FIG. 6D, a cleaning process is performed after the dielectric 130 is formed. The particles P130 are detached in the cleaning process. As a result, a defect portion F130 in which the thickness of the dielectric 130 is locally thin is generated (refer to FIG. 6E).

The upper electrode 140 is formed. As a result, the capacitor 100 shown in FIGS. 5A and 5B is obtained.

As shown in FIG. 5B, the thickness D130a of the dielectric 130 in the defect portion F130 is thinner than the thickness D130 of the dielectric 130 in a region in which the defect portion F130 is not included. The thicknesses D130 and D130a correspond to an electrode distance from the lower electrode 120 to the upper electrode 140. The thickness D130a of the dielectric 130 in the defect portion F130 depends on a timing at which the particles P130 are attached during the formation of the dielectric 130. However, the timing at which the particles P130 are attached cannot be controlled.

In other words, in the process of manufacturing the capacitor 100, fine foreign substances (the particles P130) may be attached during the formation of the dielectric 130. Due to this attachment, the capacitor 100 includes the defect portion F130. In the defect portion F130, the thickness D130a of the dielectric 130 is locally thin. In other words, the thickness F130a of the dielectric 130 in the defect portion F130 is thinner than the thickness D130 of the dielectric 130 in the region in which the defect portion F130 is not included. According to this configuration, an electric field strength generated in the vicinity of the defect portion F130 becomes high. As the electric field strength increases, a dielectric breakdown voltage necessarily decreases. When a high electric field strength is applied, a time to the dielectric breakdown of the dielectric 130 at a relevant position becomes short. In other words, time dependency dielectric breakdown (TDDB) is reduced. As a result, the reliability of the capacitor 100 is reduced. The thickness D130a of the dielectric 130 in the defect portion F130 cannot be controlled either. Therefore, it is not possible to control generation of a region in which the dielectric breakdown voltage is reduced and a region in which a TDDB lifetime is reduced.

Hereinafter, an effect of the method of manufacturing the capacitor according to the disclosure will be described in detail. The method of manufacturing the capacitor according to the disclosure has a first difference and a second difference in view of problems of the method of manufacturing the capacitor according to the comparative example. The first difference is that the dielectric thicknesses D31a and D32a of the dielectric 30 in the portion to which the particles P31 and P32 are attached can be suppressed from becoming locally thin. The term "locally thin" refers to, for example, the thickness of the dielectric 30 at which an electric field strength greater than a threshold value is generated. The second difference is that the dielectric thicknesses D31a and D32a of the dielectric 30 in the defect portions F31 and F32 can be controlled. As a result, even when the attachment of the particles P31 and P32 occurs in an initial stage of film formation, desired dielectric thicknesses D31a and D32a can be secured after removal of the particles P31 and P32. It is practically impossible to completely suppress the generation of the particles P31 and P32. However, the problem regarding the dielectric thicknesses D31a and D32a of the dielectric 30 caused by the attachment of the particles P31 and P32 can be solved by the step of forming the first dielectric layer 31 (Step S13a), the step of performing the cleaning process on the first dielectric layer 31 (Step S13b), the step of forming the second dielectric layer 32 (Step S13c), and the step of performing the cleaning process on the second dielectric layer 32 (Step S13d).

That is, in the method of manufacturing a capacitor according to the disclosure, the dielectric 30 formed on the lower electrode 20 is formed by being divided a plurality of times (Steps S13a and S13c). Moreover, the method of manufacturing a capacitor includes performing the cleaning for the purpose of the removal of the particles P31. Furthermore, in the method of manufacturing a capacitor, the cleaning process (Step S13b) performed on the first dielectric layer 31 formed first and the cleaning process (Step S13d) performed on the second dielectric layer 32 in the subsequent stage are different from each other.

In summary, in the method of manufacturing a capacitor according to the disclosure, the dielectric 30 is formed by laminating it a plurality of times (Steps S13a and S13c). Additionally, the upper surface of the first dielectric layer 31 is cleaned by at least one of jet cleaning and dual fluid cleaning (Step S13b). According to this cleaning, it is possible to remove the particles P31 attached to the first dielectric layer 31 during the laminating. The second dielectric layer 32 is formed after the cleaning. Therefore, even when the thickness of the first dielectric layer 31 is reduced due to the particles P31 attached to the surface during the laminating of the first dielectric layer 31, the thickness of the dielectric 30 is compensated by the second dielectric layer 32 formed after the removal of the particles P31. Therefore, a desired electrode distance can be ensured in the dielectric 30 including the first dielectric layer 31 and the second dielectric layer 32. As a result, the variation in the reliability of the capacitor 1 can be reduced.

Figure 7A:
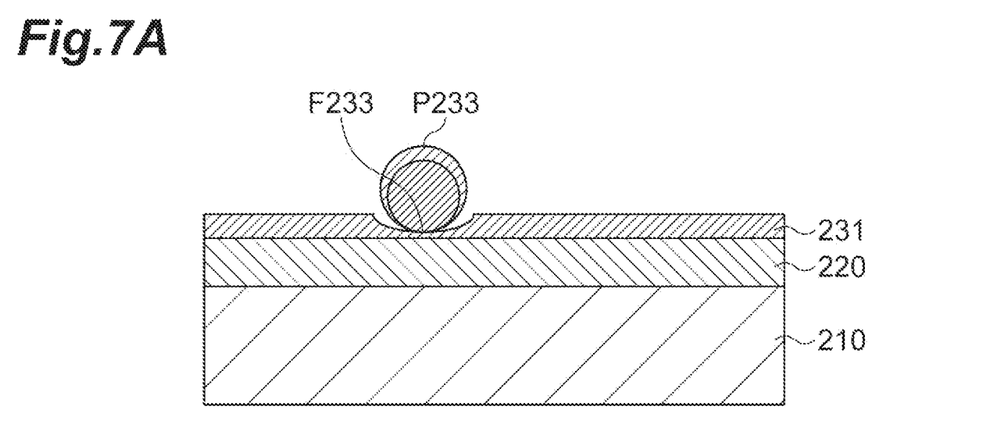
FIGS. 7A and 7B are views for explaining the main steps in the method of manufacturing the capacitor according to the comparative example.
Figure 7B:
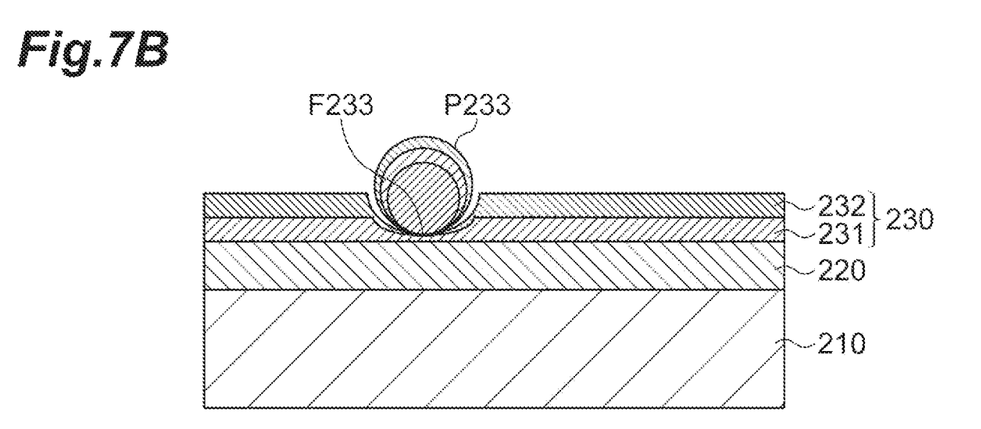

As a comparative example, as shown in FIG. 7A, it is assumed that even when the cleaning process is performed during the formation of the first dielectric layer 231, the particles P233 cannot be removed. The particles P233 serve as eaves, and the second dielectric layer 232 is not formed below the eaves (refer to FIG. 7B). That is, the formation of the second dielectric layer 232 is hindered in the region in which the particles P233 are attached. Therefore, the dielectric thickness of the dielectric 230 in the region in which the particles P233 are attached becomes thinner. As a result, the dielectric thickness is equal to the thickness of the first dielectric layer 231.

Therefore, the jet cleaning method and the dual fluid cleaning method are adopted in the cleaning process of Step S13b. The cleaning process for the first dielectric layer 31 (the dielectric layer to be formed first) uses either the jet cleaning method or the dual fluid cleaning method. The jet cleaning method and the dual fluid cleaning method have high performance for removing the particles. Therefore, the particles P31 attached to the first dielectric layer 31 can be more reliably removed. As a result of removing the particles P31 of the first dielectric layer 31, it is possible to obtain an effect that the defect portion F31 of the first dielectric layer 31 is compensated by the second dielectric layer 32.

In the cleaning process of Step S13d, either the immersion cleaning method or the shower cleaning method is adopted. That is, in the cleaning process for the second dielectric layer 32 which is the uppermost layer, either the immersion cleaning method or the shower cleaning method is used. The immersion cleaning method and the shower cleaning method are less likely to cause damage to the second dielectric layer 32. According to Step S13d, the particles P32 attached to the second dielectric layer 32 can be removed. As a result, it is possible to suppress occurrence of a defect which occurs in the upper electrode 40 due to the particles P32.

In short, (1) a minimum value of the thickness of the plurality of dielectric layers formed at different timings is equal to or greater than a predetermined thickness. The first dielectric layer 31 for which this minimum thickness is set is not the uppermost layer. Here, the "uppermost layer" is a layer in which the upper electrode 40 is formed. That is, the first dielectric layer 31 is not the uppermost layer. Therefore, the upper electrode 40 is not formed on the first dielectric layer 31. (2) The dielectric thickness D30 of the dielectric 30 is a thickness which gives a predetermined capacitance value per unit area. (3) One of jet cleaning and dual fluid cleaning is used for the cleaning process of the layer which is not the uppermost layer. The layer which is not the uppermost layer is the first dielectric layer 31. That is, either jet cleaning or dual fluid cleaning is used for the cleaning process of the first dielectric layer 31.

The capacitor 1 is obtained by the method of manufacturing a capacitor according to the disclosure. The defect portion F31 of the first dielectric layer 31 in the capacitor 1 is compensated by the second dielectric layer 32 above the first dielectric layer 31. Similarly, the defect portion F32 of the second dielectric layer is compensated by the first dielectric layer 31. The first dielectric layer 31 is formed before the second dielectric layer 32. Therefore, an effect in which the defect portion F32 of the second dielectric layer 32 is compensated by the first dielectric layer 31 can be obtained.

The density of the particles and the particle size of the particles are estimated. The probability of the particles being generated at the same place in each film formation is at most about $10^{-12}$. In addition, the probability of the particles being attached to the same place is at most about $10^{-12}$. That is, the possibility of the particles being generated and/or attached to the same place for each film formation can be practically ignored. In other words, when the dielectric 30 has at least two layers and the two dielectric layers 31 and 32 are formed at different timings, the probability of the particles being attached to the same place or places in which at least a part thereof overlaps each other is at most about $10^{-12}$. In other words, it can be practically ignored.

The particles may be attached at the start of the first film formation, and the film formation may not be performed at all at the place to which the particles are attached. However, a dielectric film having a predetermined film thickness or more is formed at a portion to which the particles are attached in the second film formation. Also, the particles attached to the dielectric layer are removed by performing the cleaning process on the dielectric layer. As a result, the defect portion formed in the dielectric layer can be compensated by one or more other dielectric layers formed on the upper side thereof. Further, a minimum thickness of the dielectric layer is set to, for example, 50 nm. According to this setting, the electric field strength applied to the dielectric 30 can be set to be equal to or less than the maximum electric field strength which does not lead to the dielectric breakdown.

The method of manufacturing a capacitor of the disclosure is not limited to the content of the above disclosure. Various modifications of the method of manufacturing a capacitor of the disclosure are possible.

For example, the case in which the first target thickness T31 of the first dielectric layer 31 is equal to the second target thickness T32 of the second dielectric layer 32 has been exemplified. A total thickness of the first target thickness T31 and the second target thickness T32 is determined by a capacity per unit area determined from a dielectric constant of the dielectric 30. That is, the first target thickness T31 may be different from the second target thickness T32. For example, it is assumed that the total thickness is 200 nm. In this case, the first target thickness T31 may be 50 nm, and the second target thickness T32 may be 150 nm. That is, the second target thickness T32 may be set to be larger than the first target thickness T31.

In the above-described embodiment, the dielectric 30 is divided into two laminating steps (Steps S13a and S13c). However, the number of divisions (the number of laminating steps) of the step of forming the dielectric 30 is not limited to two. The number of laminating steps may be three. In addition, the number of laminating steps may be three or more.

The cleaning process of the uppermost second dielectric layer 32 may be omitted. The upper electrode 40 is formed on the second dielectric layer 32. When the particles P31 are attached to the second dielectric layer 32, the particles P32 are covered by the metallic portion of the upper electrode 40. As a result, the particles P32 can be fixed to the second dielectric layer 32 by the upper electrode 40.

What is claimed is:

1. A capacitor having an MIM, comprising:
    a lower electrode;
    an upper electrode; and
    dielectric layers laminated on an upper surface of the lower electrode from the lower electrode to the upper electrode to form a dielectric for the capacitor;
    wherein the dielectric layers include a first dielectric layer having a first thickness on an upper surface of the lower electrode, and a second dielectric layer having a second thickness on an upper surface of the first dielectric layer and being in contact with the upper electrode,
    wherein, in plan view of the capacitor, the dielectric has a first defect portion and a second defect portion at different locations,
    wherein the first defect portion is a depression at the upper surface of the first dielectric layer and does not go through the first dielectric layer to the lower electrode, and
    wherein the second defect portion is a depression at the upper surface of the second dielectric layer and does not go through the second dielectric layer to the first dielectric layer.

2. The capacitor according to claim 1,
    wherein the first and second laminated dielectric layers together have a minimum total thickness, and
    wherein when the first thickness is represented by T31, the second thickness is represented by T32, the thickness of the first defect portion is represented by T31a, and the thickness of the second defect portion is represented by T32a,
    the sum of T31+T32a is not less than the minimum total thickness, and
    the sum of T31a+T32 is not less than the minimum total thickness.

3. The capacitor according to claim 2, wherein the minimum total thickness is 50 nm.

4. The capacitor according to claim 3, wherein T31 is 100 nm and T32 is 100 nm.

5. The capacitor according to claim 1,
    wherein the first dielectric layer consists of a single dielectric material and the second dielectric layer consists of a single dielectric material.

* * * * *